United States Patent

Lan et al.

(10) Patent No.: US 7,830,015 B2
(45) Date of Patent: Nov. 9, 2010

(54) MEMORY DEVICE WITH IMPROVED DATA RETENTION

(75) Inventors: Zhida Lan, Cupertino, CA (US); Sameer Haddad, San Jose, CA (US); Steven Avanzino, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 717 days.

(21) Appl. No.: 11/089,708

(22) Filed: Mar. 25, 2005

(65) Prior Publication Data

US 2006/0214304 A1   Sep. 28, 2006

(51) Int. Cl.
   *H01L 23/48* (2006.01)
(52) U.S. Cl. ................................................. 257/762
(58) Field of Classification Search ........... 257/306, 257/310, 62, 304, E21.018, E21.011, E21.021, 257/E51.028, E51.029, E45.002, E45.003, 257/296, 326, 762
   See application file for complete search history.

(56) References Cited

U.S. PATENT DOCUMENTS

| 6,780,783 B2* | 8/2004 | Lai et al. ..................... 438/745 |
| 7,026,702 B2* | 4/2006 | Krieger et al. ............... 257/464 |
| 7,148,144 B1* | 12/2006 | Avanzino .................... 438/687 |
| 2003/0053350 A1* | 3/2003 | Krieger et al. ............... 365/200 |
| 2003/0155602 A1* | 8/2003 | Krieger et al. ............... 257/306 |
| 2003/0178667 A1* | 9/2003 | Krieger et al. ............... 257/306 |
| 2003/0179633 A1* | 9/2003 | Krieger et al. ............... 365/200 |
| 2004/0026729 A9* | 2/2004 | Krieger et al. ............... 257/306 |
| 2005/0006643 A1 | 1/2005 | Lan et al. ...................... 257/40 |
| 2006/0214183 A1* | 9/2006 | Gaun et al. ................... 257/106 |
| 2006/0256608 A1* | 11/2006 | Chen et al. ................... 365/148 |
| 2007/0007510 A1* | 1/2007 | Sokolik et al. ................ 257/40 |
| 2007/0007585 A1* | 1/2007 | Sokolik et al. ............... 257/326 |

OTHER PUBLICATIONS

A.F. Wright and J.S. Nelson, "Theory of copper vacancy in cuprous oxide", Nov. 15, 2002, Journal of Applied Physics, vol. 92, No. 10, pp. 5849-5851.*

"Theory of copper vacancy in cuprous oxide", A. F. Wright and J. S. Nelson, Journal of Applied Physics, vol. 92, No. 10, Nov. 15, 2002, pp. 5849-5851.

Bishop, Doped Transition Metal Oxides: Networks of Local Distortions Correlated by Electric Fields, JPCS, 2003, pp. 1449-1454.

Wright, Nelson, Theory of the Copper Vacancy in Cuprous Oxide, Journal of Applied Physics, Nov. 15, 2002, vol. 92, No. 10, pp. 5849-5851.

* cited by examiner

*Primary Examiner*—Steven Loke
*Assistant Examiner*—Tram H Nguyen

(57) ABSTRACT

The present memory device include first and second electrodes, a passive layer between the first and second electrodes, and an active layer between the first and second electrodes and into which ions from the passive layer may be provided, and from which the ions may be provided into the passive layer. The active layer is made up of a base material and an impurity therein. The combined the material and impurity have a lower diffusion coefficient than the base material alone.

16 Claims, 4 Drawing Sheets

MEMORY DEVICE WITH IMPROVED DATA RETENTION

BACKGROUND OF THE INVENTION

1. Technical Field

This invention relates generally to memory devices, and more particularly, to a memory device with improved data retention.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state, also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory device 30 which includes advantageous characteristics for meeting these needs. The memory device 30 includes a Cu electrode 32, a $Cu_2S$ passive layer 34 on the electrode 32, a $Cu_2O$ active layer 36 on the layer 34, and a Ti electrode 38 on the active layer 36. Initially, assuming that the memory device 30 is unprogrammed, in order to program the memory device 30, an increasingly negative voltage is applied to the electrode 38, while the electrode 32 is held at ground, so that an increasing electrical potential is applied across the memory device 30 from a higher to a lower potential in the direction from electrode 32 to electrode 38, until electrical potential $V_{pg}$ (the "programming" electrical potential) is reached (see FIG. 2, a plot of memory device current vs. electrical potential applied across the memory device 30). This potential $V_{pg}$ is sufficient to cause copper ions to be attracted from the superionic layer 34 toward the electrode 38 and into the active layer 36, causing the active layer 36 (and the overall memory device 30) to switch to a low-resistance or conductive state (A). Upon removal of such potential (B), the copper ions drawn into the active layer 36 during the programming step remain therein, so that the active layer 36 (and memory device 30) remain in a conductive or low-resistance state, as indicated by the resistance characteristic (B).

In order to erase the memory device (FIG. 2), an increasingly positive voltage is applied to the electrode 38, while the electrode 32 is held at ground, so that an increasing electrical potential is applied until electrical potential $V_{er}$ (the "erase" electrical potential) is applied across the memory device 30 from a higher to a lower electrical potential in the reverse direction. This potential $V_{er}$ is sufficient to cause copper ions to be repelled from the active layer 36 toward the electrode 32 and into the superionic layer 34 (C), in turn causing the active layer 36 (and the overall memory device 30) to be in a high-resistance or substantially non-conductive state. This state remains upon removal of such potential from the memory device 30.

FIG. 2 also illustrates the read step of the memory device 30 in its programmed (conductive) state and in its erased (nonconductive) state. An electrical potential $V_r$ (the "read" electrical potential) is applied across the memory device 30 from a higher to a lower electrical potential in the same direction as the electrical potential $V_{pg}$. This electrical potential is less than the electrical potential $V_{pg}$ applied across the memory device 30 for programming (see above). In this situation, if the memory device 30 is programmed, the memory device 30 will readily conduct current (level L1), indicating that the memory device 30 is in its programmed state. If the memory device 30 is erased, the memory device 30 will not conduct current (level L2), indicating that the memory device 30 is in its erased state.

Reference is made to the paper THEORY OF COPPER VACANCY IN CUPROUS OXIDE by A. F. Wright and J. S. Nelson, Journal of Applied Physics, Volume 92, Number 10, pages 5849-5851, Nov. 15, 2002, which is hereby incorporated by reference. That paper describes the process of diffusion of copper ions through $Cu_2O$. In the diffusion process, typically involving a vacancy mechanism wherein atoms jump from a first (atom) state to a second (vacancy) state, atoms need energy to break bonds with neighbors and to provide necessary distortion of the material between the states. The above-cited paper indicates that the activation energy $E_a$ for moving a copper ion from one state to the next in the $Cu_2O$ is approximately 0.3 eV. FIG. 3 illustrates movement (arrow F) from state 1 (unprogrammed) to state 2 (programmed). In such process, the activation energy is indicated by the arrow $E_{a1}$. FIG. 4 illustrates movement (arrow G) from state 2 (programmed) to state 1 (unprogrammed). In such process, the activation energy is indicated by the arrow $E_{a2}$.

It has been found that with this relatively low barrier energy $E_{a2}$ to movement of copper ions through the $Cu_2O$, over a period of time, copper ions in the active layer of a programmed memory device can readily diffuse through and drift from the active layer 36 into the passive layer 34, undesirably reducing the conductivity of the programmed memory device 30, i.e., causing the memory device 30 to undesirably lose its programmed state. It will readily be seen that loss of programmed state results in data loss. Therefore, what is needed a memory device which stably retains its conductive, low resistance state to ensure proper data retention

DISCLOSURE OF THE INVENTION

Broadly stated, the present memory device comprises first and second electrodes, a passive layer between the first and second electrodes, an active layer between the first and second and into which a charged specie from the passive layer may be provided, and from which said charged specie may be provided into the passive layer, the active layer comprising a first material and a second material, the first material having a first diffusion coefficient, the combined first and second materials having a second diffusion coefficient different from the first diffusion coefficient.

Broadly stated, the present method of fabricating a memory device comprises providing a first electrode, providing a passive layer on the first electrode, providing a material on the passive layer, the material having a first diffusion coefficient, introducing an impurity into the material, the combined material and impurity providing an active layer, the combined material and impurity having a second diffusion coefficient different from the first diffusion coefficient, and providing a second electrode on the active layer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
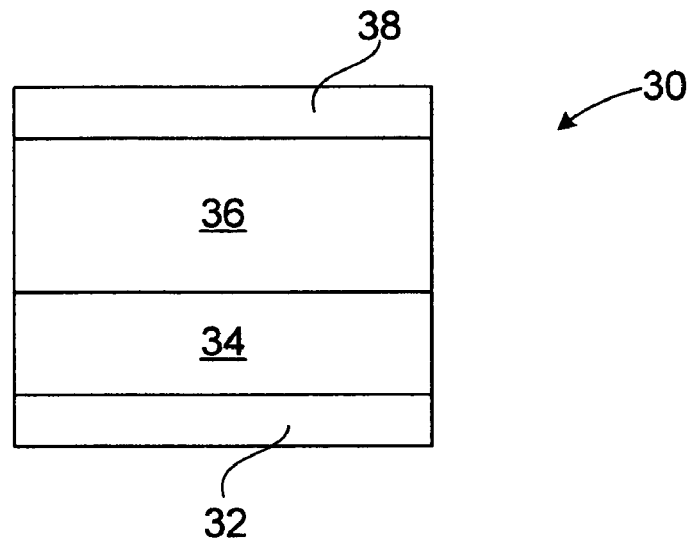
FIG. 1 is a cross-sectional view of a typical memory device.
Figure 2:
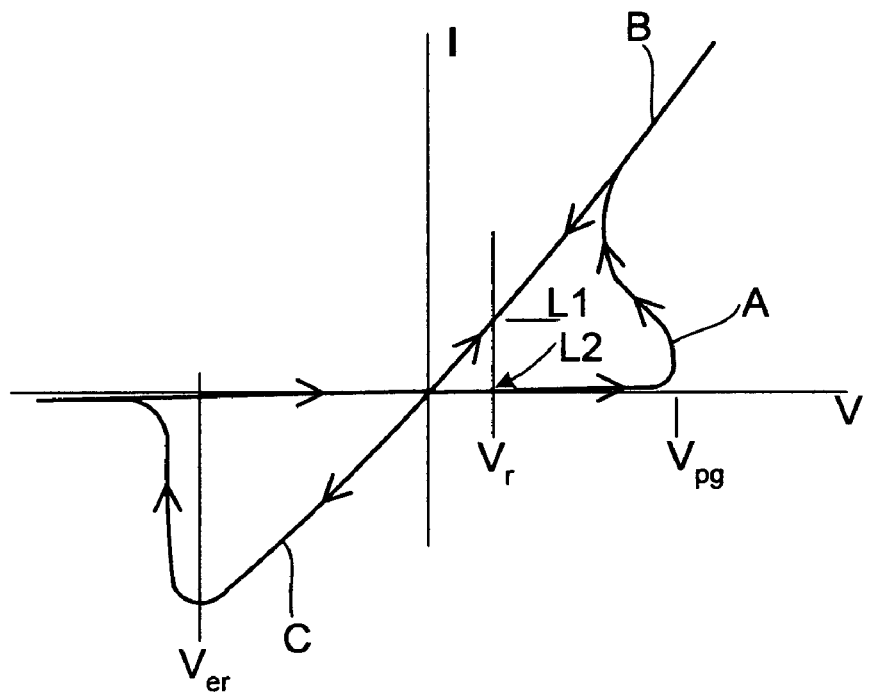
FIG. 2 is a plot of current vs. voltage in the programming, erasing, and reading of the memory device of FIG. 1.
Figure 3:
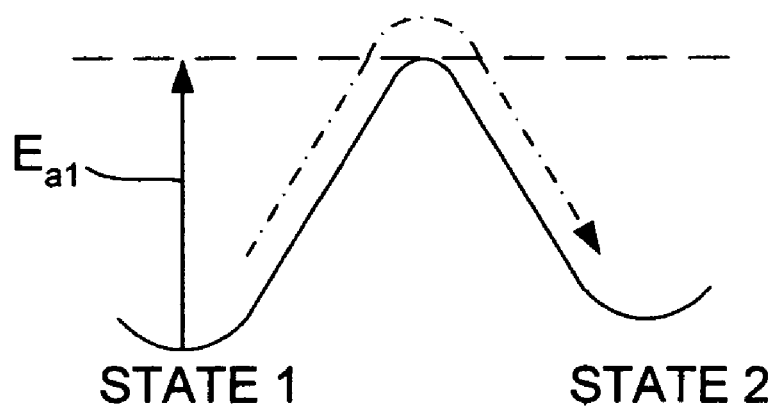
FIGS. 3 and 4 are graphs illustrating activation energy of the device of FIG. 1.
Figure 4:
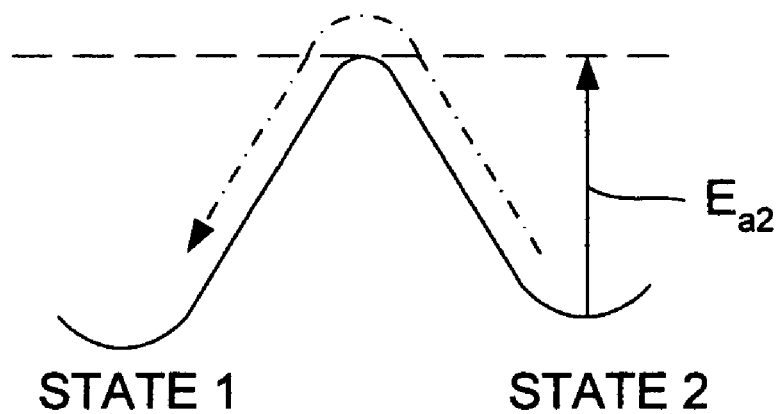
Figure 5:
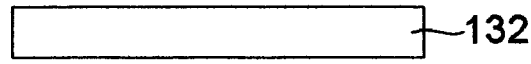
FIG. 5-8 illustrate the fabrication of the present memory device.
Figure 6:
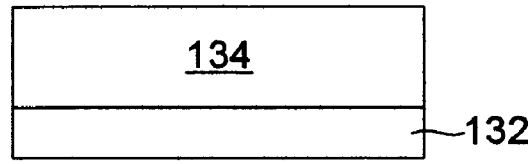
Figure 7:
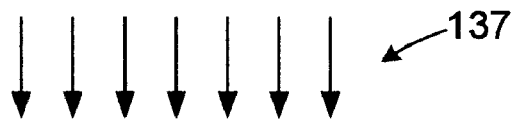
Figure 7:
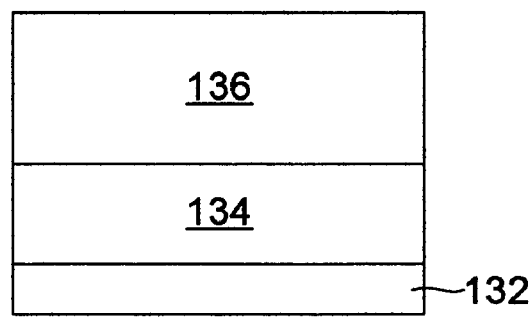
Figure 8:
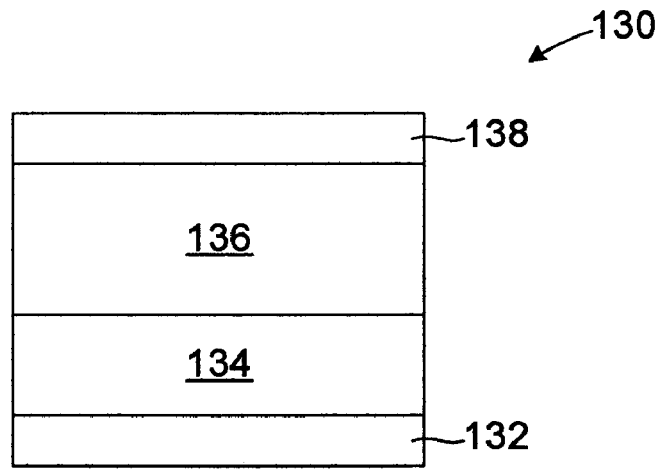

Referring to FIG. 5, in the fabrication of the present memory device, a copper electrode 132 is initially provided. A $Cu_2S$ passive layer 134 is provided on and over the electrode 132 (FIG. 6), and an active layer 136 is provided on and over the passive layer 134. The active layer 136 mainly of the $Cu_2O$ material, also includes and contains a second material in the form of an impurity, for example aluminum (Al) or indium (In) as indicated in the above-cited paper, which may be introduced into the $Cu_2O$ by any suitable means (indicated at 137). Then, an electrode 138 of for example titanium is provided on and over the active layer 136. The electrodes 132, 138, passive layer 134 and active layer 136 (containing $Cu_2O$ and either Al or In) form the present memory device 130, with the passive and active layers 134, 136 between the electrodes 132, 138.

The diffusion coefficient of a body is given as $$D = D_0 e^{-\frac{E_a}{kT}}$$

where
D=diffusion coefficient
$D_0$=parameter of material (both matrix and diffusing specie) independent of temperature
$E_a$=activation energy for diffusion
k=Boltzmann's constant
T=temperature As noted above, the activation energy for moving a copper ion from one state to the next in the $Cu_2O$ is approximately 0.3 eV. The introduction of Al atoms into the $Cu_2O$ material greatly increases the activation energy for moving copper ions from state 2 (programmed) to state 1 (unprogrammed), to a level $E_{a3}$>1.0 eV. (see FIG. 9). Thus, the activation energy for copper ions in the programmed state 2 in the combined materials $Cu_2O$ and Al is substantially greater than the activation energy for copper ions in the programmed state 2 in the $Cu_2O$ material alone. In accordance with the above formula, increasing the activation energy $E_a$ decreases the diffusion coefficient D, so that the diffusion coefficient of the combined materials $Cu_2O$ and Al is substantially lower than the diffusion coefficient of the $Cu_2O$ alone.

Figure 9:
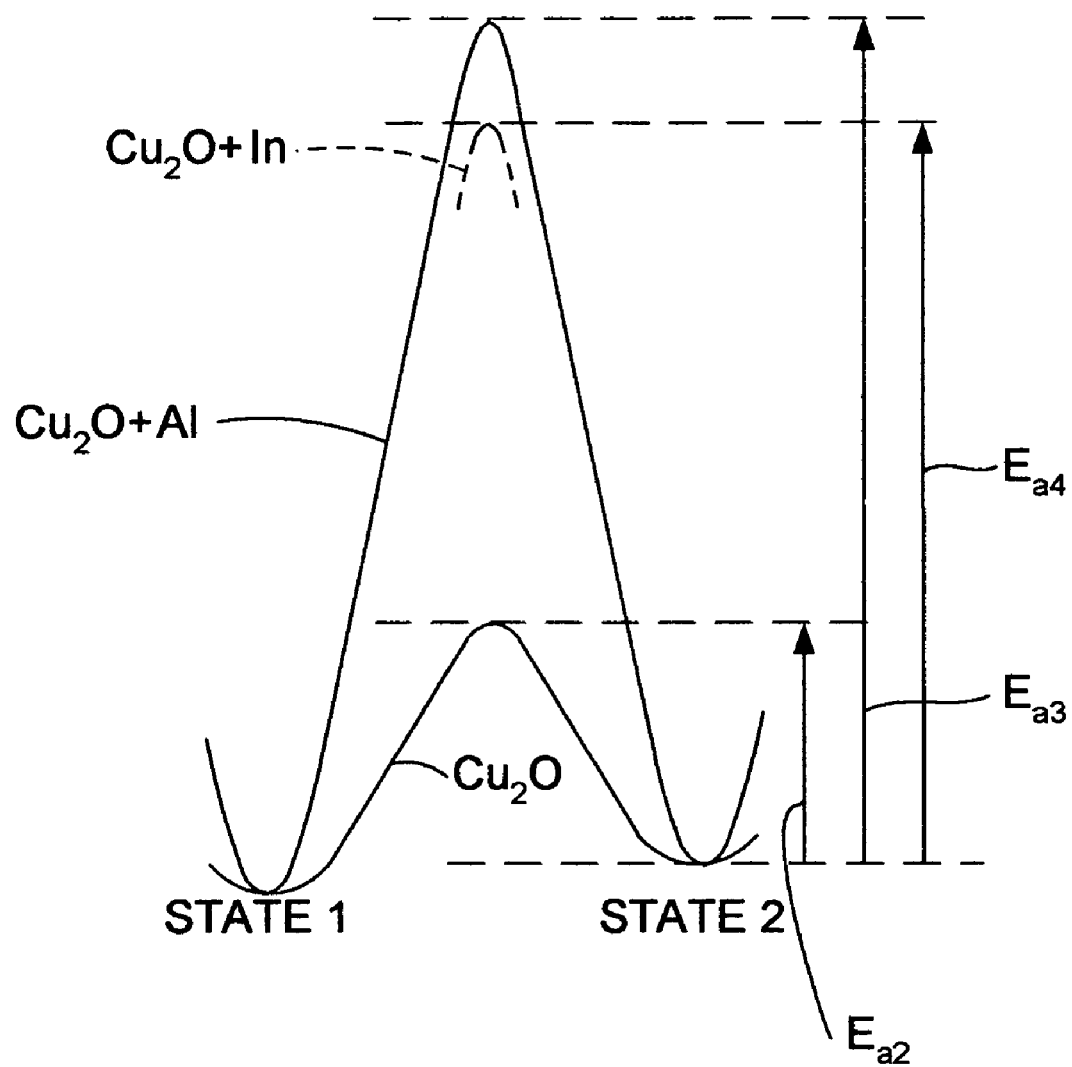
FIG. 9 is a graph illustrating activation energies of different embodiments of the present memory device.

The introduction of In atoms into the $Cu_2O$ material also greatly increases the activation energy for moving copper ions from state 2 (programmed) to state 1 (unprogrammed) (activation energy $E_{a4}>1.0$ eV, see FIG. 9). Thus, the activation energy for copper ions in the programmed state 2 in the combined materials $Cu_2O$ and In is substantially greater than the activation energy for copper ions in the programmed state 2 in the $Cu_2O$ material alone. In accordance with the above formula, increasing the activation energy $E_a$ decreases the diffusion coefficient D, so that the diffusion coefficient of the combined materials $Cu_2O$ and In is substantially lower than the diffusion coefficient of the $Cu_2O$ alone.

In a programmed memory device, these low diffusion coefficients, indicative of resistance to diffusion, greatly inhibit the movement of copper ions of the programmed memory device 130 through the active layer 136, in turn inhibiting the diffusion of copper ions through and from the active layer 136 into the passive layer 134. Because of the low diffusion coefficients, the undesirable reduction in conductivity of the programmed memory device 130 described above is avoided, so that the memory device 130 retains its programmed, conductive, low resistance state to ensure proper data retention.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
    first and second electrodes;
    a passive layer between the first and second electrodes; and
    an active layer between the first and second electrodes;
    the active layer comprising a first active layer material and a second active layer material in the first active layer material, the first active layer material having a first diffusion coefficient, the combined first and second active layer materials having a second diffusion coefficient different from the first diffusion coefficient.

2. The memory device of claim 1 wherein the second diffusion coefficient is lower than the first diffusion coefficient.

3. The memory device of claim 2 wherein the second active layer material comprises an impurity in the first active layer material.

4. The memory device of claim 1 wherein the second active layer material comprises metal atoms.

5. The memory device of claim 4 wherein the first active layer material comprises copper.

6. The memory device of claim 5 wherein the first active layer material comprises $Cu_2O$.

7. The memory device of claim 4 wherein the second active layer material comprises aluminum.

8. The memory device of claim 4 wherein the second active layer material comprises indium.

9. A memory device comprising:
    first and second electrodes;
    a passive layer between the first and second electrodes;
    an active layer between the first and second electrodes and into which a charged specie from the passive layer is provided, and from which said charged specie is provided into the passive layer;
    the active layer comprising a first active layer material and a second active layer material in the first active layer material, the first active layer material having a first diffusion coefficient, the combined first and second active layer materials having a second diffusion coefficient different from the first diffusion coefficient.

10. The memory device of claim 9 wherein the second diffusion coefficient is lower than the first diffusion coefficient.

11. The memory device of claim 10 wherein the charged specie is copper ions.

12. The memory device of claim 11 wherein the first active layer material comprises copper.

13. The memory device of claim 12 wherein the first active layer material comprises $Cu_2O$.

14. The memory device of claim 9 wherein the second active layer material comprises metal atoms.

15. The memory device of claim 14 wherein the second active layer material comprises aluminum.

16. The memory device of claim 14 wherein the second active layer material comprises indium.

* * * * *